United States Patent
Kronholz et al.

(10) Patent No.: US 8,481,381 B2
(45) Date of Patent: Jul. 9, 2013

(54) SUPERIOR INTEGRITY OF HIGH-K METAL GATE STACKS BY PRESERVING A RESIST MATERIAL ABOVE END CAPS OF GATE ELECTRODE STRUCTURES

(75) Inventors: Stephan-Detlef Kronholz, Dresden (DE); Peter Javorka, Radeburg (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 44 days.

(21) Appl. No.: 13/232,711

(22) Filed: Sep. 14, 2011

(65) Prior Publication Data
US 2013/0065329 A1   Mar. 14, 2013

(51) Int. Cl.
*H01L 21/336* (2006.01)
*H01L 21/8234* (2006.01)

(52) U.S. Cl.
USPC .............. 438/197; 438/9; 438/208; 438/680; 257/E21.006; 257/E21.023; 257/E21.027; 257/E21.042; 257/E21.051; 257/E21.056; 257/E21.058; 257/E21.17; 257/E21.135; 257/E21.218; 257/E21.319; 257/E21.32

(58) Field of Classification Search
USPC .................. 438/197, 199, 207, 208, 217, 311, 438/9, 680; 257/E21.006, E21.023, E21.027, 257/E21.042, E21.051, E21.058, E21.056, 257/E21.17, E21.135, E21.218, E21.319, 257/E21.37
See application file for complete search history.

(56) References Cited

U.S. PATENT DOCUMENTS

| | | | |
|---|---|---|---|
| 7,659,170 B2 * | 2/2010 | Schwan et al. | 438/296 |
| 8,349,694 B2 * | 1/2013 | Kronholz et al. | 438/275 |
| 2010/0124815 A1 | 5/2010 | Sudo | 438/585 |
| 2010/0193866 A1 * | 8/2010 | Mulfinger et al. | 257/337 |
| 2010/0244155 A1 | 9/2010 | Carter et al. | 257/410 |
| 2011/0024846 A1 * | 2/2011 | Kammler et al. | 257/369 |
| 2012/0161243 A1 * | 6/2012 | Kronholz et al. | 257/369 |
| 2012/0282744 A1 * | 11/2012 | Javorka et al. | 438/199 |

FOREIGN PATENT DOCUMENTS

| | | |
|---|---|---|
| DE | 102009015715 A1 | 10/2010 |
| DE | 102009035409 A1 | 2/2011 |
| DE | 10 2011 079 919 A1 | 1/2013 |

OTHER PUBLICATIONS

Translation of Official Communication from German Patent Office for German Patent Application No. 10 2011 090 165.5 dated May 8, 2012.
Translation of Official Communication from German Patent Application No. 10 2011 090 165.5 dated Feb. 4, 2013.

* cited by examiner

*Primary Examiner* — David Nhu
(74) *Attorney, Agent, or Firm* — Williams, Morgan & Amerson, P.C.

(57) ABSTRACT

When forming high-k metal gate electrode structures in a semiconductor device on the basis of a basic transistor design, undue exposure of sensitive materials at end portions of the gate electrode structures of N-channel transistors may be avoided, for instance, prior to and upon incorporating a strain-inducing semiconductor material into the active region of P-channel transistors, thereby contributing to superior production yield for predefined transistor characteristics and performance.

10 Claims, 8 Drawing Sheets

SUPERIOR INTEGRITY OF HIGH-K METAL GATE STACKS BY PRESERVING A RESIST MATERIAL ABOVE END CAPS OF GATE ELECTRODE STRUCTURES

BACKGROUND OF THE INVENTION

1. Field of the Invention

Generally, the present disclosure relates to the fabrication of highly sophisticated integrated circuits including advanced transistor elements that comprise gate structures including a high-k gate dielectric material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of integrated circuits, field effect transistors represent one important type of circuit element that substantially determines performance of the integrated circuits. Generally, a plurality of process technologies are currently practiced for forming field effect transistors, wherein, for many types of complex circuitry, CMOS technology is one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the mobility of the charge carriers in the channel region.

The continuous shrinkage of critical dimensions of transistor elements has resulted in a gate length of field effect transistors of 50 nm and significantly less, thereby providing sophisticated semiconductor devices having enhanced performance and an increased packing density. The increase of electrical performance of the transistors is strongly correlated with a reduction of the channel length, which may result in an increased drive current and switching speed of the field effect transistors. On the other hand, the reduction of the channel length is associated with a plurality of issues in terms of channel controllability and static leakage currents of these transistors. It is well known that field effect transistors with a very short channel may require an increased capacitive coupling between the gate electrode structure and the channel region in order to provide the desired static and dynamic current flow controllability. Typically, the capacitive coupling is increased by reducing the thickness of the gate dielectric material, which is typically formed on the basis of a silicon dioxide base material, possibly in combination with a nitrogen species, due to the superior characteristics of a silicon/silicon dioxide interface. Upon implementing a channel length of the above-identified order of magnitude, however, the thickness of the silicon dioxide based gate dielectric material may reach values of 1.5 nm and less, which in turn may result in significant leakage currents due to a direct tunneling of the charge carriers through the very thin gate dielectric material. Since the exponential increase of the leakage currents upon further reducing the thickness of silicon dioxide based gate dielectric materials is not compatible with the thermal power design requirements, other mechanisms have been developed so as to further enhance transistor performance and/or reduce the overall transistor dimensions.

For example, by creating a certain strain component in the channel region of silicon-based transistor elements, the charge carrier mobility and, thus, the overall conductivity of the channel may be enhanced. For a silicon material with a standard crystallographic configuration, i.e., a (100) surface orientation with the channel length direction oriented along a <110> equivalent direction, tensile strain in the current flow direction may enhance conductivity of electrons, thereby improving transistor performance of N-channel transistors. On the other hand, generating a compressive strain in the current flow direction may increase the mobility of holes and may, thus, provide superior conductivity in P-channel transistors. Consequently, a plurality of strain-inducing mechanisms have been developed in the past, wherein internal strain-inducing sources, such as an embedded strain-inducing semiconductor material, have proven to be very efficient strain-inducing mechanisms. For example, frequently, the incorporation of a compressive strain-inducing silicon/germanium alloy in the drain and source areas of P-channel transistors is applied in order to enhance performance of these transistors. For this purpose, in an early manufacturing stage, cavities are formed in the active region laterally adjacent to the gate electrode structure of the P-channel transistor, while the N-channel transistors are covered by a spacer layer and a resist mask. These cavities may be subsequently refilled with the silicon/germanium alloy on the basis of selective epitaxial growth techniques. During the etch process for forming the cavities and during the subsequent epitaxial growth process, the gate electrode of the P-channel transistor has to be encapsulated in order to not unduly expose sensitive materials of the gate electrode structure, such as a silicon-based electrode material, to the process ambient for forming the cavities and for selectively growing the silicon/germanium alloy. Thereafter, the gate electrode structures may be exposed and the further processing may be continued by forming drain and source regions in accordance with any appropriate process strategy.

Basically, the above-described strain-inducing mechanism is a very efficient concept for improving transistor performance of P-channel transistors, wherein the efficiency of the finally obtained strain in the channel region of the transistor, however, strongly depends on the internal strain level of the semiconductor alloy and on the lateral offset of this material from the channel region. Typically, the material composition of the strain-inducing semiconductor alloy is restricted by currently available sophisticated selective epitaxial deposition recipes, which, in the case of a silicon/germanium alloy, may presently not allow germanium concentrations of significantly more than approximately 30 atomic percent. Consequently, a further improvement of the total strain in the channel region requires a reduction of the lateral offset of the silicon/germanium alloy from the channel region so that any protective spacer structures may have to be provided with a reduced width.

In addition to providing strain-inducing mechanisms in sophisticated field effect transistors, also sophisticated gate electrode materials have been proposed in order to overcome the restrictions of conventional silicon dioxide/polysilicon based gate electrode structures. To this end, the conventional silicon dioxide based gate dielectric material is replaced, at least partially, by a so-called high-k dielectric material, i.e., a dielectric material having a dielectric constant of 10.0 and higher, which may result in a desired high capacitance between the gate electrode and the channel region, while nevertheless a certain minimum physical thickness is provided so as to keep the resulting leakage currents at an acceptable level. For this purpose, a plurality of dielectric materials, such as hafnium oxide based materials, zirconium oxide, aluminum oxide and the like, are available and may be used in sophisticated gate electrode structures. Furthermore, the polysilicon material may also be replaced, at least in the vicinity of the gate dielectric material, since typically polysilicon suffers from charge carrier depletion in the vicinity of the gate dielectric material, which may reduce the effective capacitance. Moreover, with sophisticated high-k gate dielectric materials, the work function of standard polysilicon materials obtained by a corresponding doping may no longer be sufficient to provide the required electronic characteristics of the gate electrode material in order to obtain a desired threshold voltage of the transistors under consideration. For this reason, specific work function adjusting metal species, such as aluminum, lanthanum and the like, are typically incorporated in the gate dielectric material and/or in an appropriate electrode material in order to obtain a desired work function and also increase conductivity of the gate electrode material at least in the vicinity of the gate dielectric material.

Thus, a plurality of sophisticated process strategies have been developed, wherein, in some promising approaches, the sophisticated gate materials, such as a high-k dielectric material and a metal-containing electrode material, possibly including a work function adjusting metal species, may be provided in an early manufacturing stage in combination with a polysilicon material, thereby providing a high degree of compatibility with conventional process strategies for forming sophisticated field effect transistors. It turns out, however, that a reliable confinement of the sensitive material system, including the high-k dielectric material and the metal-containing electrode material, has to be guaranteed in order to avoid a shift in threshold voltage or any other variabilities of the sophisticated high-k metal gate electrode structures.

In an attempt to further enhance device performance of sophisticated field effect transistors, it has been proposed to combine sophisticated high-k metal gate electrode structures with a strain-inducing mechanism, for instance, by incorporating a strain-inducing semiconductor alloy in the active regions of the transistors. In this case, the encapsulation of the gate electrode structure of the transistor, which may require the incorporation of an embedded strain-inducing semiconductor alloy, may have to be implemented on the basis of detrimental requirements. On the one hand, the confinement of the gate electrode structure has to ensure integrity of the sensitive material system, for example, prior to, during and after the incorporation of the strain-inducing semiconductor material, and, on the other hand, a reduced thickness of any protective spacer elements, such as silicon nitride based materials, is to be implemented in view of enhancing efficiency of the strain-inducing mechanism. Consequently, a compromise of thickness of the spacer elements and gain in performance of sophisticated transistors is typically applied.

Consequently, in sophisticated process strategies in which the sophisticated metal gate electrode structures are formed in an early manufacturing stage, reliable confinement of the sensitive gate materials is mandatory in order to not unduly compromise overall production yield. It has been observed, however, that significant gate failures may occur, in particular in the gate electrode structures of N-channel transistors, as will be described in more detail with reference to FIGS. 1a-1h.

FIG. 1a schematically illustrates a top view of a semiconductor device 100 in which a gate layer stack 160s is formed above active regions 102a, 102b, 102c and an isolation region (not shown), wherein a part of the gate layer stack 160s is already patterned to a certain degree, thereby providing substantially stripe-like hard mask layers 164.

It should be appreciated that, for convenience, the active regions 102a, 102b, 102c are visible, although these regions are actually covered by the gate layer stack 160s, which may be described in more detail with reference to the following figures. In the example shown, the active region 102a corresponds to a semiconductor region in and above which P-channel transistors are to be formed, while the active regions 102b, 102c represent the semiconductor regions of N-channel transistors. Furthermore, as illustrated, the hard mask layers 164, which may be comprised of any appropriate material system, such as silicon dioxide, silicon nitride and the like, are patterned so as to substantially implement a desired gate length, as indicated by 160l, while the patterning of the hard mask material 164 in a direction along a width direction W is to be accomplished in a later manufacturing stage. That is, in this stage, the hard mask layers 164 substantially define the lateral dimension of the gate electrode structures still to be formed from the gate layer stack 160s along a gate length direction, as indicated by the gate length 160l, while an appropriate patterning along the width direction W has to be performed on the basis of an additional lithography and patterning process sequence in order to adjust a desired lateral distance 160d of neighboring gate electrode structures that are aligned to each other along the width direction.

FIG. 1b schematically illustrates a top view of the semiconductor device 100 in a further advanced manufacturing stage. As illustrated, the hard mask layers 164 are now also patterned so as to implement the desired lateral dimension of gate electrode structures still to be formed along the width direction W, thereby determining the lateral distance 160d in accordance with the basic design rules. It should be appreciated that the distance 160d provides for a separation of corresponding gate electrode structures along the width direction in order to ensure electrical insulation of individual gate electrode structures, when required by the overall circuit layout. The patterning of the hard mask material 164 is typically accomplished by using an additional mask material and patterning the same so as to provide a trench therein, which is appropriately dimensioned in order to obtain the distance 160d upon patterning the underlying hard mask material 164 on the basis of the additional mask material.

FIG. 1c schematically illustrates a cross-sectional view of the semiconductor device 100 according to the section as indicated by Ic in FIG. 1b. As shown, the semiconductor device 100 comprises a substrate 101, such as a silicon material or any other appropriate carrier material for forming thereabove a semiconductor layer 102, such as a silicon layer or any other appropriate semiconductor material which comprises a significant amount of silicon. The semiconductor layer 102 is divided into the various active regions by means of an isolation region 103, which in turn is comprised of appropriate dielectric materials, such as silicon dioxide, silicon nitride and the like. In the sectional view of FIG. 1c, the active regions 102a, 102b are illustrated, wherein the active region 102a comprises a threshold voltage adjusting semiconductor alloy 104, for instance in the form of a silicon/germanium alloy. As previously discussed, the semiconductor material 104 is typically required for appropriately adjusting the threshold voltage offset between P-channel transistors and N-channel transistors for a given complex configuration of a gate electrode structure still to be formed for these transistors. Furthermore, the gate layer stack 160s is illustrated so as to comprise a layer system 161, which includes at least a high-k dielectric material, typically in combination with an additional very thin conventional dielectric material, thereby enhancing the overall interface characteristics between the layer system 161 and the active region 102a comprising the alloy 104 and the active region 102b. Furthermore, frequently, the layer system 161 comprises an electrode material, for instance in the form of titanium nitride, tantalum nitride and the like, wherein also appropriate metal species may be incorporated so as to obtain a desired work function for the gate electrode structures still to be formed. It should be appreciated that any such work function adjusting metal species may be selected differently for P-channel transistors and N-channel transistors. For example, materials such as aluminum, lanthanum and the like may be used in a corresponding electrode material and/or within the dielectric material of the layer system 161, wherein appropriate metal species may be diffused into the dielectric material on the basis of appropriately selected anneal processes upon forming the layer system 161. In this case, the basic electronic characteristics of the P-channel transistors to be formed in and above the active region 102a and the N-channel transistors to be formed in and above the active region 102b may be adjusted in an early manufacturing stage, i.e., prior to actually patterning the gate electrode structures and completing the overall transistor configurations. Furthermore, the gate layer stack 160s may comprise an additional electrode material 162, such as a silicon material and the like, followed by the hard mask layer system 164 which, in this manufacturing stage, is already patterned in one lateral direction so as to substantially determine the gate length 160l of gate electrode structures still to be formed.

The semiconductor device 100 as shown in FIG. 1c may be formed on the basis of the following processes. The isolation region 103 is typically formed on the basis of sophisticated lithography, etch, deposition, anneal and planarization techniques, wherein the lateral size and shape of the isolation region 103 is appropriately selected so as to define the lateral size and shape of the active regions in the layer 102. Prior to or after forming the isolation region 103, the basic dopant concentration in the corresponding active regions is implemented, for instance, by performing implantation processes in combination with appropriate masking steps. Next, an appropriate hard mask is formed so as to selectively cover the active regions of transistors which do not require the threshold voltage adjusting semiconductor material 104. In FIGS. 1a, 1b and 1c, these active regions may correspond to the active regions 102b, 102c. To this end, any appropriate hard mask material, such as silicon dioxide, is formed and is selectively removed from the active region 102a, while other active regions are covered by an appropriate mask. Thereafter, the exposed active region 102a may be prepared for a subsequent selective epitaxial growth process in order to form the material 104. During the patterning of the corresponding hard mask material and also during any further cleaning steps for preparing the active region 102a, a significant degree of recessing 103r may be generated in the isolation structure 103 in the vicinity of the active region 102a, which may have a significant influence on the further processing. Thereafter, the gate layer stack 160s is formed, for instance, by first providing the material system 161, which may include a plurality of deposition and patterning processes in order to form a high-k dielectric material in combination with appropriate work function metal species and an appropriate electrode material, as discussed above. To this end, well-established process recipes are available. For convenience, individual metal layers of the system 161 as well as the difference in electronic characteristics, such as work function and the like, are not shown in FIG. 1c. Next, the electrode material 162 is deposited in combination with the hard mask system 164, which is accomplished on the basis of well-established deposition techniques. Next, the hard mask material 164 is patterned so as to form the corresponding stripe-like configuration as shown in FIG. 1a, thereby basically defining the gate length 160l. To this end, an appropriate mask may be formed, for instance on the basis of resist, which may be patterned by using sophisticated lithography techniques, followed by appropriate resist trim processes, as are well established in the art. Thereafter, an etch process is performed in order to etch through the layer 164.

Thereafter, further mask material (not shown) may be deposited and may be patterned so as to form an appropriate mask opening, which basically defines the lateral distance 160d (FIG. 1a), which may be accomplished by using a further lithography and etch sequence in order to pattern the hard mask materials 164 for determining a lateral size of these materials along the width direction, i.e., in FIG. 1c, the direction perpendicular to the drawing plane, as is also illustrated in FIG. 1b, thereby actually implementing the lateral distance 160d. Thereafter, the additional mask material is removed and the patterned hard mask material 164 is used for patterning the remaining layers of the gate layer stack 160s on the basis of sophisticated patterning techniques.

FIG. 1d schematically illustrates the semiconductor device 100 in a further advanced manufacturing stage, i.e., in a manufacturing stage in which gate electrode structures 160a, 160b are patterned and formed above the active regions 102a, 102b, respectively. Hence, the gate electrode structures 160a, 160b comprise the material system 161 followed by the electrode material 162 and a dielectric cap layer system, which represents the remaining portion of the hard mask material 164. Consequently, the gate electrode structures 160a, 160b are provided with a desired complex configuration including a high-k dielectric material in the system 161 and having appropriate lateral dimensions, such as a desired gate length 160l (FIG. 1c). Moreover, as discussed above, P-channel transistors to be formed in and above the active region 102a have to be implemented on the basis of an embedded strain-inducing silicon/germanium alloy in order to further enhance performance of the device 100. Furthermore, as also discussed above, in particular the sensitive materials in the system 161 have to be confined in order to avoid undue contact with aggressive chemicals, as are typically required for performing efficient cleaning processes, for instance by using well-established cleaning agents, such as SPM (sulfuric acid/hydrogen peroxide mixture) and the like. Consequently, a protective liner or spacer is to be formed on sidewalls of the gate electrode structures 160a, 160b, which also may define the lateral offset of a strain-inducing semiconductor material to be formed selectively in the active region 102a. To this end, an appropriate dielectric material, such as silicon nitride, is typically deposited in a highly conformal manner with a desired high material density in order to provide a moderately thin yet highly robust material layer, thereby attempting to ensure reliable confinement of the material system 161 and also provide a desired reduced lateral offset of the strain-inducing material to be formed in the active region 102a.

FIG. 1e schematically illustrates the semiconductor device 100 in a further advanced manufacturing stage. As shown, a spacer layer 163 is formed in a conformal manner above the active regions 102a, 102b, the isolation region 103 and above the gate electrode structures 160a, 160b. The thickness and material composition of the spacer layer 163 is selected so as to basically meet the above-addressed requirements with respect to confinement of sensitive material and providing a reduced lateral offset. To this end, a plurality of well-established deposition techniques, such as multi-layer deposition, low pressure chemical vapor deposition (CVD) and the like, are available. Thereafter, a resist mask 105 is formed so as to cover the gate electrode structure 160b and the active region 102b, in which the strain-inducing semiconductor material is not to be formed. Due to the very pronounced surface topography of the isolation region 103 in the vicinity of the active region 102a, however, the exposure and patterning process for forming the resist mask 105 may suffer from topography-related irregularities, thereby forming a pronounced resist foot, as indicated by 105f, at the foot or lower portion of the resist mask 105, which in turn may significantly affect the further processing of the device 100 upon patterning the spacer layer 163 and forming recesses in the active region 102a.

FIG. 1f schematically illustrates a cross-sectional view of the semiconductor device 100 in a sectional view as indicated by the line If in FIG. 1b. As shown, in this section, the isolation region 103 laterally separates the active region 102a from the active region 102c and also comprises a significant recess in the vicinity of the active region 102a. Moreover, a gate electrode structure 160c is formed above the active region 102c and extends above the isolation region 103. As also explained above with reference to FIGS. 1a and 1b, the gate electrode structures 160a, 160c are thus separated substantially by the lateral distance 160d, which ensures electrical isolation of the gate electrode structures 160a, 160c while still ensuring that the gate electrode structures 160a, 160c completely span the corresponding active regions 102a, 102c, respectively. Furthermore, as shown, the resist mask 105 is formed so as to cover the active region 102c and the gate electrode structure 160c since the incorporation of a strain-inducing semiconductor material is not required in the active region 102c, as discussed above. Due to the pronounced footing of the resist mask 105, as explained above, and due to the fact that the undue lateral dimensions of the mask 105 at the foot of the gate electrode structures may not be acceptable for the further processing, a further resist etch process 106 is applied in order to reduce the lateral dimensions of the resist mask 105 at the lower portions of the gate electrode structures. For example, typically, an oxygen-based plasma etch process with short exposure time may be applied, wherein, however, a significant material erosion has to be induced so as to remove unwanted resist material portions. On the other hand, generally material erosion is induced in the mask 105, thereby resulting in a reduced resist mask 105r which, however, may even expose an end portion 160e of the gate electrode structure 160c so that, in particular, the spacer layer 163 at the end portion 160e may be exposed during the further processing.

FIG. 1g schematically illustrates the semiconductor device 100 in a manufacturing stage in which an etch sequence 115 is performed in the presence of the reduced resist mask 105r so that sidewall spacers 163s are formed from an exposed portion of the spacer layer 163 during a first phase of the etch sequence 115. Furthermore, typically, the etch sequence 115 is continued so as to etch into the active region 102a, while using the cap material 164, the spacers 163s and the resist mask 105r as an etch mask. Consequently, during the further processing, cavities 114 may be formed in the active region 102a, wherein the lateral offset of the cavities 114 with respect to a channel region 153 is substantially determined by the spacer 163s.

Again referring to FIG. 1f, during the process 115 as shown in FIG. 1g, the material of the spacer layer 163 in the end portion 160e may be exposed to the plasma etch ambient, thereby contributing to a certain degree of material erosion and thus also forming a spacer portion at the end portion 160e of the gate electrode structure 160c.

FIG. 1h schematically illustrates the semiconductor device 100 in a cross-sectional view according to the section as indicated as Ic in FIG. 1b. As shown, a strain-inducing semiconductor material 151, for example in the form of a silicon/germanium alloy and the like, is formed in the cavities 114, which may be accomplished by applying selective epitaxial growth techniques, wherein, after the removal of the resist mask 105r (FIG. 1g), the layer 163 (FIG. 1g) acts as a deposition mask for any active regions and gate electrode structures in which the incorporation of the strain-inducing semiconductor material 151 is not required. After the selective growth of the material 151, a further resist mask 108 may be provided so as to cover the active region 102a and the gate electrode structure 160a, while exposing the gate electrode structure 160b. On the basis of the resist mask 108, a further etch process 107 may be applied so as to form the spacers 163s on the gate electrode structure 160b from the remaining spacer layer 163 (FIG. 1g). During the etch process 107, however, the end portion of the gate electrode structure 160c (FIG. 1f) is again exposed to a reactive etch ambient and thus suffers again from a certain degree of material erosion, for instance contrary to the gate electrode structure 160a, in which the spacers 163s are formed during the etch sequence 115 (FIG. 1g), while the material 163s, however, is reliably covered by the mask 108 during the process 107. Hence, the end portion of the gate electrode structures 160b, 160c (FIG. 1f) may thus be eroded in a more pronounced manner, which may finally result in a less reliable confinement of sensitive gate materials since typically, as discussed above, the width of the spacers 163s is selected so as to enable a reduced lateral offset of the material 151 in the active region 102a. Hence, increasing the width of the spacers 163s is less than desirable in view of sacrificing significant gain in transistor performance of P-channel transistors formed in and above the active region 102a. On the other hand, with respect to the process strategy as described above, an increased probability exists for exposing sensitive gate materials to highly aggressive chemicals, such as cleaning agents, thereby contributing to a significant material erosion of these sensitive materials, which in turn results in pronounced gate failures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which gate electrode structures, such as high-k metal gate electrode structures, may be formed with superior reliability with respect to gate failures, which may, in particular, be observed in conventional strategies in gate electrode structures of N-channel transistors. To this end, it has been recognized that, as discussed above, the formation of a resist mask may result in the exposure of an end portion of gate electrode structures of N-channel transistors, which in turn may contribute to pronounced gate failures during the further processing. In order to reduce yield losses, the present disclosure contemplates process strategies in which, for a given design of P-channel transistors and N-channel transistors and corresponding gate electrode structures, the degree of material erosion upon forming a resist mask for covering active regions and gate electrode structures of one type of transistor is taken into account so as to substantially avoid the exposure of end portions of these gate electrode structures, even if an additional etch process for adjusting the final size of a resist mask is required. On the other hand, the basic design or configuration of the transistors may be preserved for a certain device layout, thereby achieving the desired transistor characteristics in terms of performance and the like, while at the same time significantly increasing overall production yield. According to some illustrative embodiments disclosed herein, superior confinement of gate electrode structures of one type of transistor, such as N-channel transistors, may be accomplished by appropriately increasing the lateral distance of end portions of gate electrode structures above an isolation region, thereby ensuring coverage of the end portions upon forming a resist mask, even if a pronounced surface topography may be present in the isolation region. In other cases, the lateral overlap of the resist mask may be increased for one type of gate electrode structure above the isolation region in order to compensate for an additional material erosion upon performing an additional resist etch process, thereby also avoiding the exposure of sensitive materials at end portions of the gate electrode structure. To this end, the process sequence, i.e., the lithography process and/or the patterning process for forming the gate electrode structures and/or the corresponding resist mask, may be adapted so as to take into consideration the corresponding material erosion during the formation of the resist mask, while in other cases, in addition to or alternatively to the above process strategy, the lithography mask may be appropriately modified so as to ensure an increased overlap of the resist mask or an increased lateral distance between neighboring end portions of gate electrode structures.

One illustrative method disclosed herein comprises determining a degree of exposure of an end portion of a gate electrode structure of a first N-channel transistor upon forming a first resist mask above the gate electrode structure, wherein the end portion is formed above an isolation region that separates an active region of the first N-channel transistor from an active region of a first P-channel transistor. The first N-channel transistor and the first P-channel transistor are formed above a first substrate according to a predefined transistor design. The method further comprises forming a second N-channel transistor and a second P-channel transistor according to the predefined transistor design above one or more second substrates by taking into consideration the determined degree of exposure so as to substantially avoid exposure of an end portion of a gate electrode structure of the second N-channel transistor formed above the one or more second substrates when forming a second resist mask for covering the gate electrode structure of the second N-channel transistor.

A further illustrative method disclosed herein comprises forming a gate layer stack of a semiconductor device above a first active region, a second active region and an isolation region that laterally separates the first and second active regions along a width direction, wherein the gate layer stack comprises a high-k dielectric material. The method further comprises forming a first gate electrode structure and a second gate electrode structure from the gate layer stack, wherein the first and second gate electrode structures are laterally aligned along the width direction and are separated above the isolation region by a lateral distance. The method further comprises forming a resist mask so as to selectively cover the second active region and the second gate electrode structure. Additionally, the method comprises performing a resist etch process based on a predefined etch recipe so as to remove resist material at least at a foot of the resist mask to provide a reduced resist mask, wherein at least one of the lateral distance and a lateral overlap of the resist mask are selected so as to avoid exposure of an end portion of a second gate electrode structure above the isolation region during the resist etch process.

According to a still further illustrative embodiment, a method comprises forming a spacer layer above a first gate electrode structure and a first active region and a second gate electrode structure and a second active region, wherein the first and second gate electrode structures extend above an isolation region and are separated along a width direction by a lateral distance above the isolation region and wherein the first active region comprises a threshold voltage adjusting semiconductor alloy. The method further comprises forming a resist mask so as to cover the second active region and the second gate electrode structure, wherein the resist mask provides a lateral overlap with respect to the second gate electrode structure above the isolation region. Moreover, the method comprises performing a mask etch process so as to remove unwanted resist material at a foot of the resist mask, wherein the lateral overlap is selected so as to avoid exposure of an end portion of the second gate electrode structure above the isolation region. The method further comprises forming a sidewall spacer selectively on the first gate electrode structure by using the resist mask as an etch mask. Moreover, cavities are formed selectively in the first active region in the presence of the resist mask. Additionally, the method comprises forming a strain-inducing semiconductor material in the cavities after removing the resist mask.

BRIEF DESCRIPTION OF THE DRAWINGS

The disclosure may be understood by reference to the following description taken in conjunction with the accompanying drawings, in which like reference numerals identify like elements, and in which.

Figure 1A:
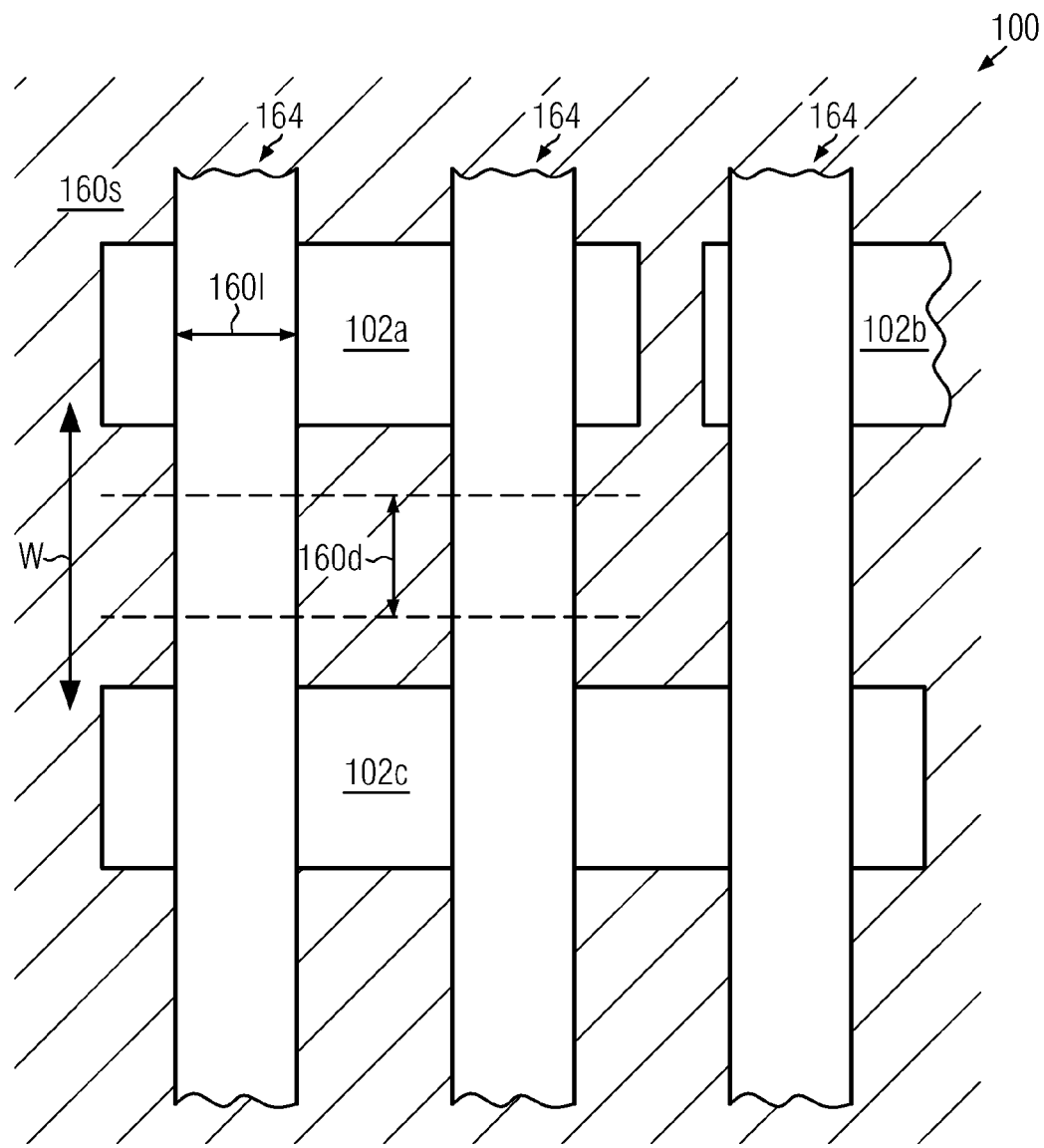
FIGS. 1a-1b schematically illustrate top views of a semiconductor device during various manufacturing stages in patterning a hard mask material of a gate layer stack.
Figure 1B:
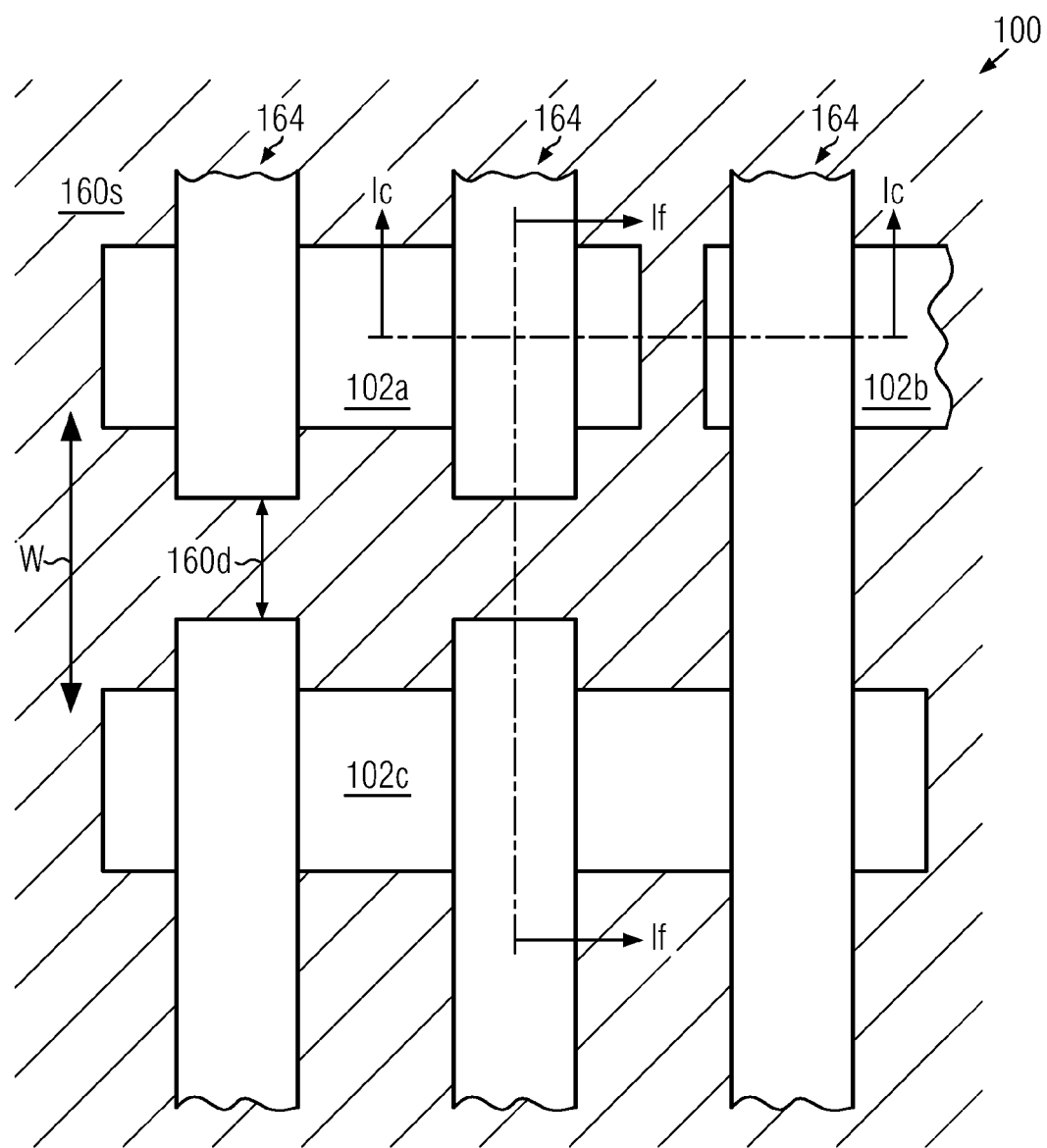
Figure 1C:
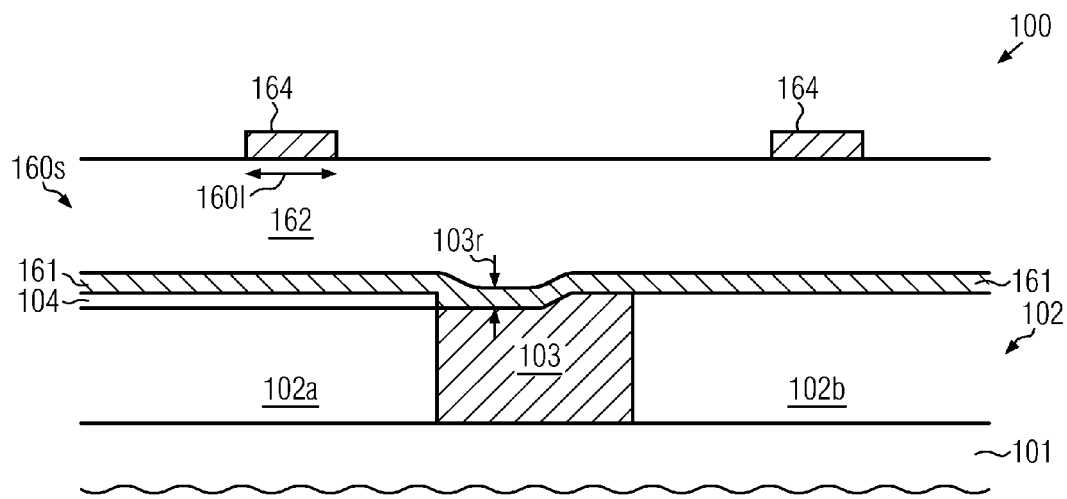
FIGS. 1c-1e schematically illustrate cross-sectional views of the semiconductor device during various manufacturing stages, according to conventional process strategies.
Figure 1D:
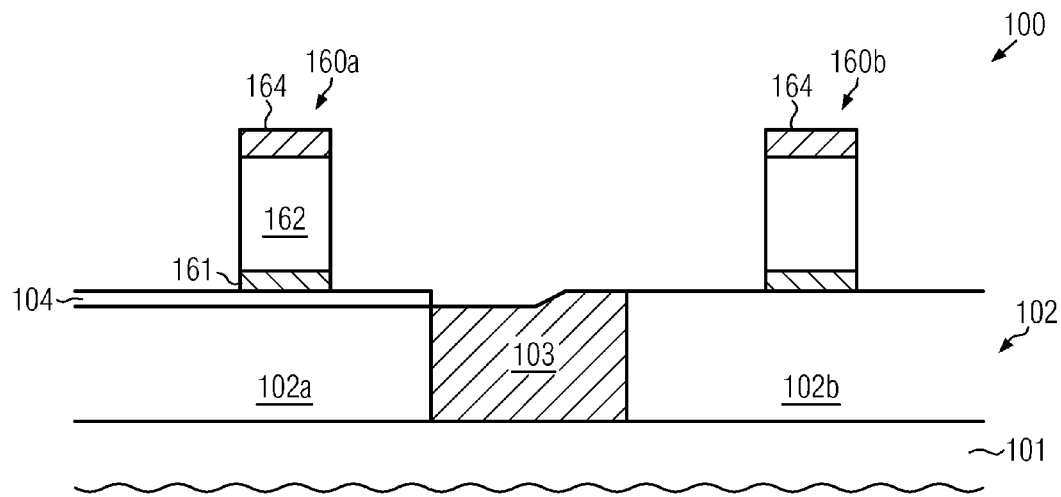
Figure 1E:
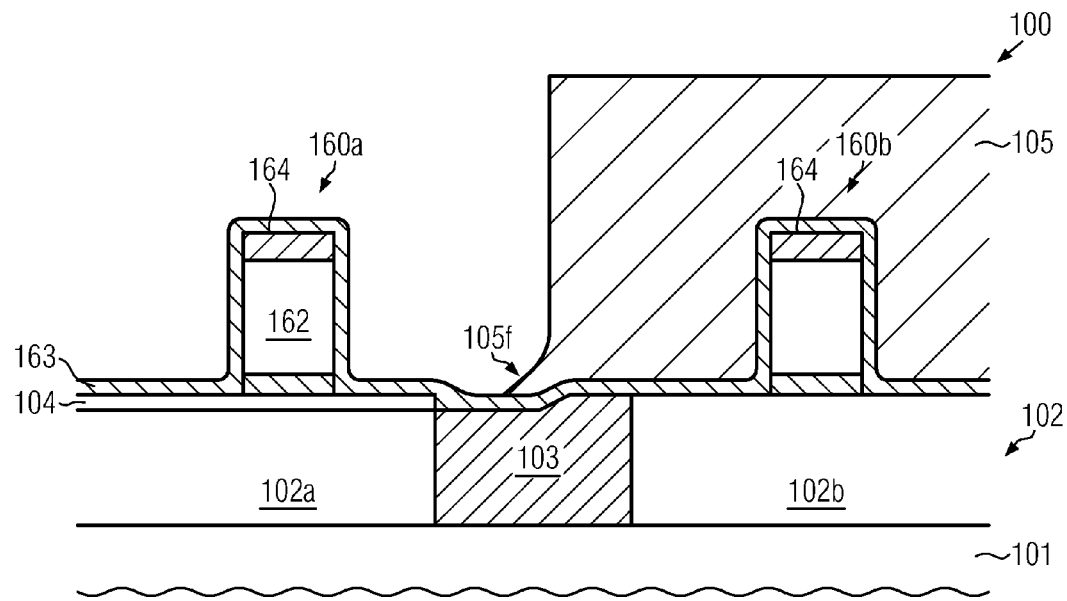

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which sophisticated gate electrode structures may be formed with reduced gate failures, for instance when implementing transistors of a specific transistor design, which may require the incorporation of a strain-inducing semiconductor material in one type of transistor and the provision of a high-k metal gate electrode structure. To this end, a source of increased yield losses has been identified as the end portion of gate electrode structures of one type of transistor that is positioned on a portion of an isolation region, which in turn may comprise a pronounced surface topography, which in turn may be caused by the process history experienced in the P-channel transistor when implementing the sophisticated transistor design. Generally, in the present application, a transistor design is to be understood as the basic transistor configuration and encloses the lateral dimension of the active region, the material composition thereof, the material composition of the gate electrode structure and the gate length. Hence, performance and the basic transistor characteristics are substantially determined by the basic transistor design, wherein a certain degree of variability may, however, be observed due to certain process variations during the entire fabrication process. It should be appreciated, however, that the basic transistor design may not require a precisely defined lateral distance along a width direction in order to electrically insulate end portions of gate electrode structures of transistors of different conductivity type above an isolation region, as long as electrical insulation is guaranteed and nevertheless the end portion is positioned above a portion of the isolation region.

It has been recognized that forming a resist mask for covering the active region and the gate electrode structure of one type of transistor, such as N-channel transistors, may have significant influence on production yield when an additional resist etch process is required for removing unwanted material residues of the resist mask. Consequently, according to the principles disclosed herein, the degree of material erosion upon forming the resist mask may be determined and the corresponding degree of material erosion may be taken into consideration upon patterning the gate electrode structures and/or forming the resist mask in order to substantially avoid undue exposure of the end portion, thereby also enhancing integrity of sensitive gate materials, such as high-k dielectric materials, sensitive electrode materials and the like. The degree of material erosion upon forming a resist mask may be readily determined on the basis of experiments and measurement techniques, such as electron microscopy and the like, so that one or more processes and/or lithography masks may be appropriately modified in order to avoid undue exposure of end portions of gate electrode structures without requiring a modification of the basic transistor design, thereby achieving the desired transistor characteristics without suffering from increased yield losses, as is the case in conventional strategies.

Figure 1F:
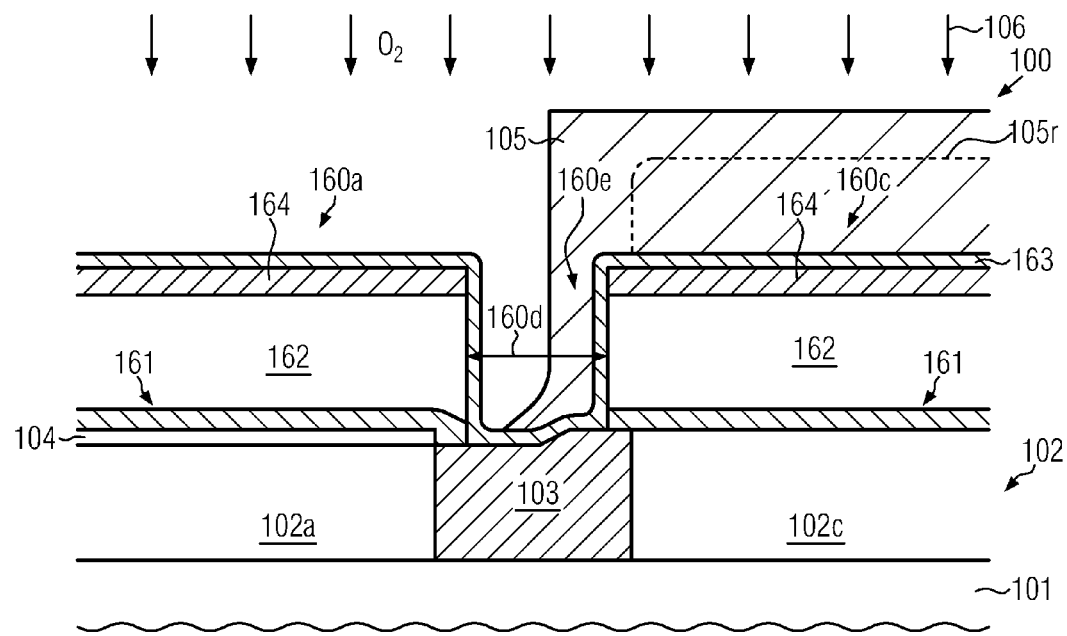
FIG. 1f schematically illustrates a cross-sectional view of the semiconductor device along a width direction when an end portion of a gate electrode structure is exposed upon forming a resist mask, according to conventional process strategies.
Figure 1G:
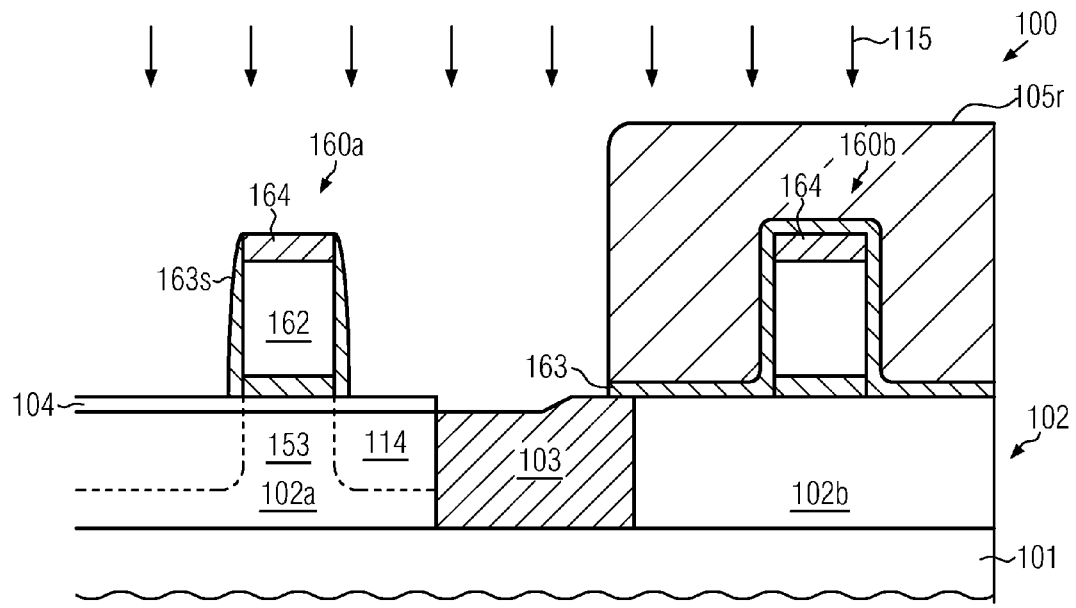
FIGS. 1g-1h schematically illustrate cross-sectional views of the semiconductor device in further advanced manufacturing stages in which a strain-inducing semiconductor material is incorporated into the active region of a P-channel transistor, according to conventional process strategies.
Figure 1H:
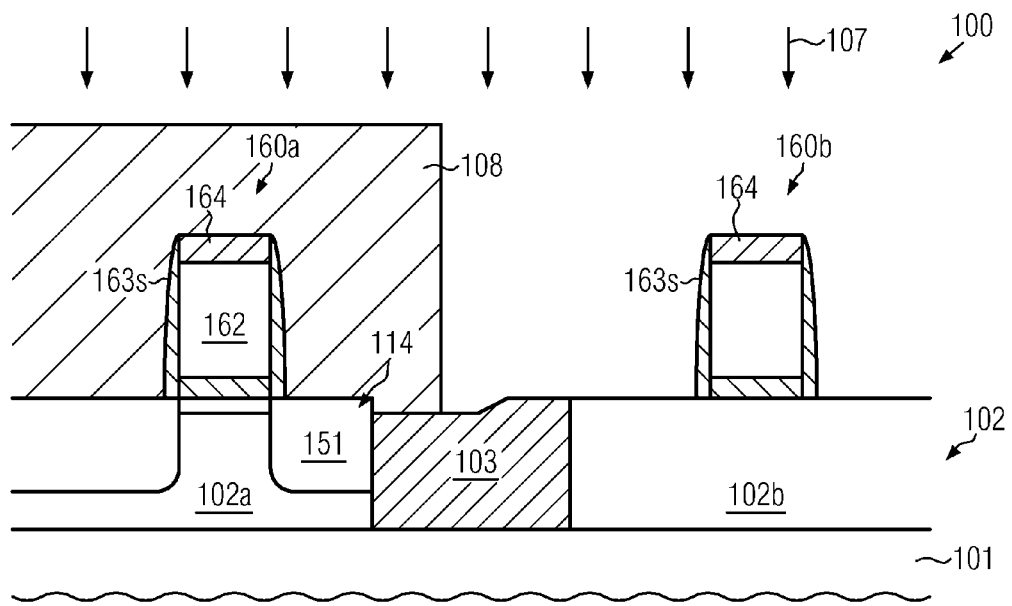

With reference to FIGS. 2a-2d, further illustrative embodiments will now be described in more detail, wherein reference is also made to FIGS. 1a-1h, wherein, in particular, FIG. 1f is referred to in the context of the determination of material erosion during the formation of a resist mask.

First, again referring to FIG. 1f, it should be appreciated that using the semiconductor device 100 as a "test device," the degree of material erosion upon forming the resist mask 105r may be readily determined. To this end, the initial resist mask 105 may be formed, as also discussed above, which does provide a certain lateral overlap with respect to the gate electrode structure 160c, wherein this overlap, however, is significantly reduced or even converted into a negative overlap, i.e., the end portion 160e may be exposed upon obtaining the actual resist mask 105r. For example, the degree of material erosion may be determined by measuring the difference in the lateral dimension between the resist mask 105 and the resist mask 105r, for instance at the top of the gate electrode structure 160c along the lateral dimension, along which also the distance 160d is oriented. To this end, well-established inspection techniques or measurement techniques may be applied, for instance electron microscopy and the like. In this case, the semiconductor device 100 may be considered as a first device comprising first N-channel transistors and P-channel transistors, for instance in the form of the gate electrode structures 160a and the active region 102a and the gate electrode structure 160c and the active region 102c, which are formed above a first substrate 101. It should be appreciated, however, that appropriate measurement data may be obtained from a plurality of responding "first" substrates 101 to determine a statistically relevant metric for the degree of material erosion caused during the etch process 106 when removing unwanted resist material from the initial resist mask 105 in order to form the actual resist mask 105r. Using the device 100 as a "test device" is advantageous since the device 100 comprises transistors of the desired specific transistor design and also provides superior authenticity with respect to the configuration of the isolation region 103, the gate electrode structures 160a, 160c and the like.

Figure 2A:
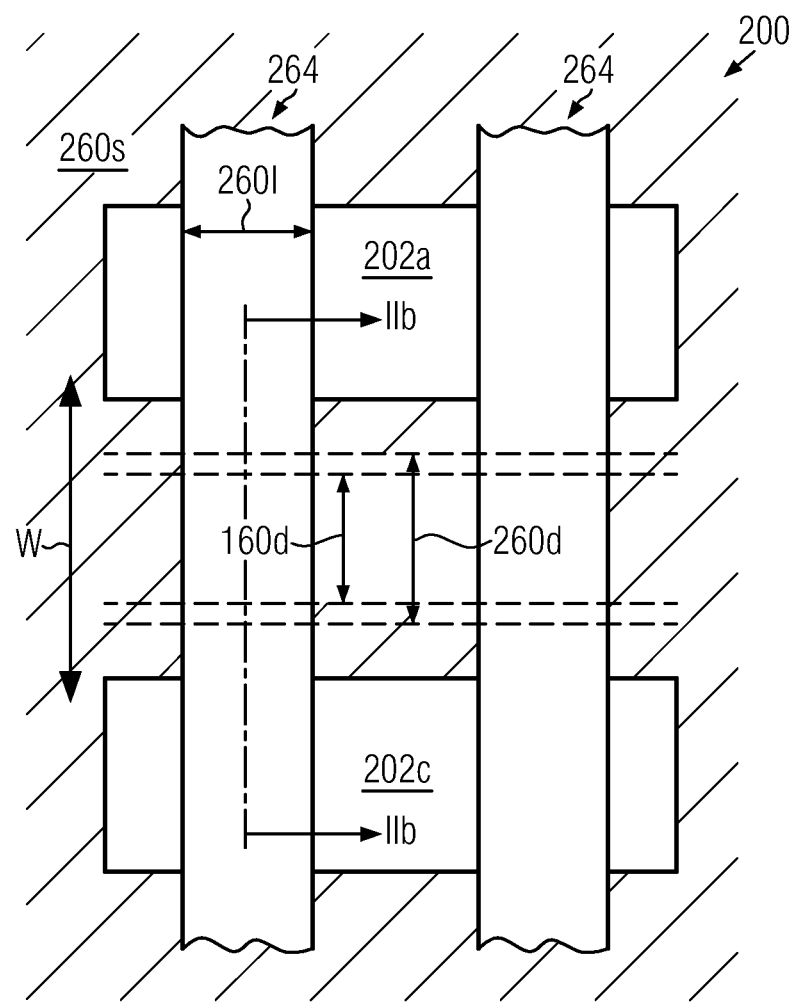
FIG. 2a schematically illustrates a top view of a semiconductor device in which gate electrode structures may be formed on the basis of a process strategy that takes into consideration the material erosion during the formation of a resist mask for selectively covering the gate electrode structure of an N-channel transistor, according to illustrative embodiments.

FIG. 2a schematically illustrates a top view of a semiconductor device 200 in which transistors of the same transistor design are to be implemented, as are also formed in the device 100, as discussed above. As shown, the device 200 may comprise a first active region 202a, for instance the active region of one or more P-channel transistors, and a second active region 202c such as the active region of one or more N-channel transistors. Furthermore, a gate layer stack 260s may be formed above the active regions 202a, 202c, wherein, for convenience, a portion of the gate layer stack 260s is assumed to be transparent so that the active regions 202a, 202c are visible in FIG. 2a. Furthermore, the gate layer stack 260s in this manufacturing stage may comprise partially patterned hard mask materials 264, thereby defining a gate length 260l, as is also discussed above with reference to the semiconductor device 100. Consequently, in a further lithography and etch sequence, the hard mask materials 264 have to be patterned along a width direction W in order to provide a lateral separation of the gate electrode structures still to be formed, wherein, in some illustrative embodiments, a lateral distance 160d may be implemented, which may basically correspond to a lateral distance as is also used in the conventional strategy, as previously discussed, while, in other illustrative embodiments, an increased lateral distance 260d may be implemented in order to provide superior confinement of the resulting gate electrode structures, as will be discussed later on.

With respect to forming the semiconductor device 200 as shown in FIG. 2a and in particular with respect to patterning the hard mask material 264, the same criteria may apply as previously discussed with respect to the semiconductor device 100.

Figure 2B:
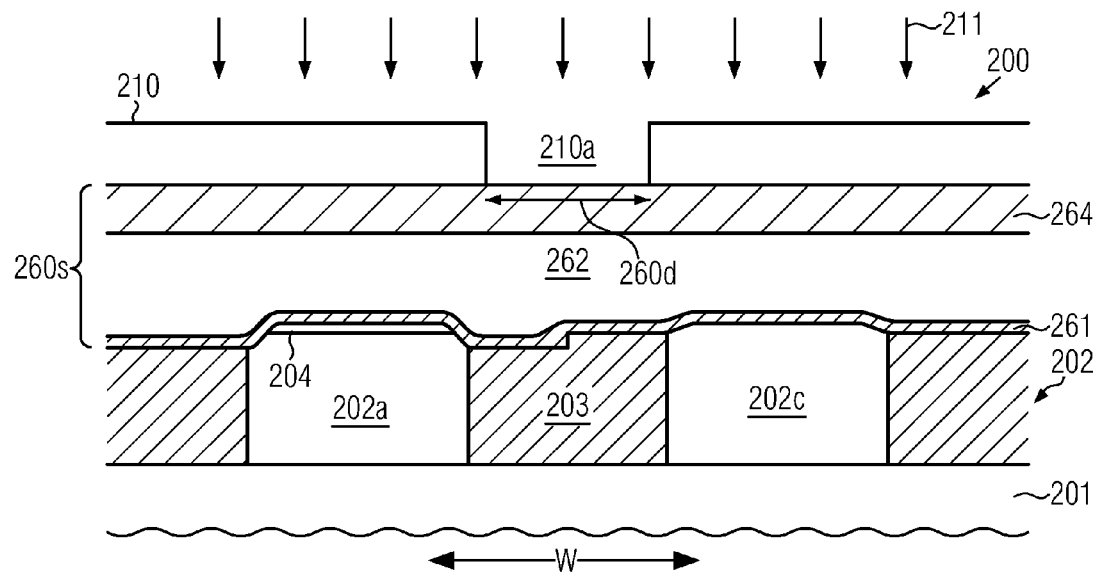
FIGS. 2b-2d schematically illustrate cross-sectional views along a transistor width direction in various manufacturing stages, according to illustrative embodiments in which superior integrity of high-k metal gate electrode structures may be achieved.

FIG. 2b schematically illustrates the semiconductor device 200 in a cross-sectional view along the line IIb of FIG. 2a. That is, the device 200 is shown in a sectional view that corresponds to a section along the width direction W. As illustrated, the device 200 may comprise a substrate 201 above which may be formed a semiconductor layer 202 comprising the active regions 202a, 202c. The active regions 202a, 202c are laterally separated by an isolation region 203, which may have the same configuration as previously discussed with reference to the device 100. Moreover, the active region 202a may comprise a threshold voltage adjusting semiconductor material 204, for instance in the form of a silicon/germanium alloy. Furthermore, the gate layer stack 260s may be formed above the active regions 202a, 202c and the isolation region 203 and may comprise a material system 261, an electrode material 262, the partially patterned hard mask material 264 and an additional mask material 210, in which an appropriate mask opening 210a is incorporated so as to determine the lateral distance between gate electrode structures still to be formed. For example, in the embodiment shown, the mask opening 210a may have a lateral width that may substantially correspond to the lateral distance 260d, as described above with reference to FIG. 2a.

In some illustrative embodiments, the components described so far may have the same basic design and thus configuration as the same components described with reference to the device 100. In this case, the device 200 may thus represent a semiconductor device that is formed on the basis of the same transistor design above the substrate 201, however, taking into consideration the previously determined degree of material erosion when forming a resist mask so as to cover a gate electrode structure to be formed above the active region 202c and a portion of the isolation structure 203. It should be appreciated, however, that, in the embodiment shown, at least the lateral distance 260d is different and in particular is increased compared to the lateral distance 160d of conventional strategies, wherein, however, this lateral distance 260d is not a characteristic measure of the basic transistor design and does not substantially affect the resulting transistor characteristics in terms of transistor behavior and performance.

Consequently, the device 200 may be formed on the basis of process strategies as described above with reference to the device 100 in order to provide the gate layer stack 260s and patterning the material 264. Thereafter, the mask material 210 may be deposited and may be patterned on the basis of a lithography and etch sequence in order to obtain the mask opening 210a having the desired increased lateral distance 260d. To this end, in some illustrative embodiments, a lithography mask (not shown) used during a lithography process in the sequence 211 may be modified so as to implement an increased lateral distance which, after completing the sequence 211, results in the desired distance 260d. Additionally or alternatively to the modification of a corresponding lithography mask used for determining the lateral distance between two neighboring gate electrode structures along the width direction W, the lithography process itself and/or a patterning sequence may be appropriately adapted so as to obtain an increased opening 210a compared to conventional strategies. For example, an exposure parameter, such as exposure time, may be appropriately determined so as to finally obtain the opening 210a having the desired lateral size 260d. For example, an appropriate "over-exposure" or "under-exposure" time may be applied, depending on the type of resist material used for patterning the mask 210 in order to obtain the required measure 260d. To this end, appropriate test runs may be performed in order to obtain an appropriate exposure parameter. Similarly, during the sequence 211, at least one etch process, possibly in combination with a deposition process and the like, depending on the overall process strategy, is to be applied in order to pattern the mask material 210. Also in this case, one or more process parameters may be modified compared to conventional strategies in order to obtain the desired lateral distance 260d. Also in this case, appropriate experiments may be carried out in order to obtain an appropriate set of parameters for the sequence 211.

As a consequence, by using the mask material 210 including the mask opening 210a with the increased lateral size 260d, the mask material 264 may be patterned along the width direction W on the basis of well-established etch recipes, thereby forming the mask materials 264 with lateral dimensions which substantially correspond to the lateral dimensions of gate electrode structures to be formed from the remaining material layers of the gate layer stack 260s, as is also discussed above with reference to the device 100.

Figure 2C:
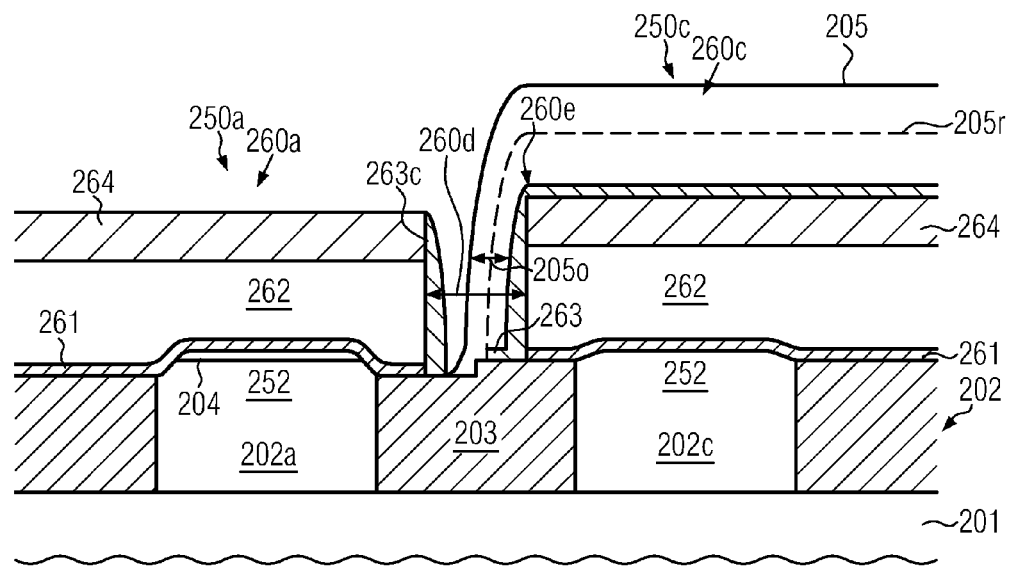

FIG. 2c schematically illustrates the device 200 in a cross-sectional view in a further advanced manufacturing stage. As shown, a first gate electrode structure 260a of a transistor 250a is formed above the active region 202a and a portion of the isolation region 203, while a gate electrode structure 260c of a transistor 250c, such as an N-channel transistor, is formed above the active region 202c and a portion of the isolation region 203. The patterning of the gate electrode structures 260a, 260c may be accomplished on the basis of process strategies, as also discussed above with reference to the device 100. Hence, the gate electrode structures 260a, 260c may be separated in the isolation region 203 with a lateral distance that may substantially correspond to the lateral distance 260d, as previously implemented on the basis of the process sequence described above with reference to FIG. 2b. Furthermore, a spacer 263s may be formed on sidewalls of the gate electrode structure 260a, while the gate electrode structure 260c as well as the active region 202c may be covered by a spacer layer 263. To this end, a process sequence may be applied, as previously described with reference to the device 100. It should thus be appreciated that the transistors 250a, 250c in this manufacturing stage may have basically the same configuration as the corresponding transistors formed in the semiconductor device 100, since the same basic transistor design has been used for forming the device 100 and the device 200, while also the same process strategies have been applied for implementing the basic transistor design, except for the lateral distance 260d, which is not considered as a parameter influencing the basic transistor design. Consequently, the isolation region 203 may thus also have a pronounced surface topography around the active region 202a, which may, for instance, have been caused during the fabrication of the threshold voltage adjusting semiconductor material 204, as discussed above. In this manufacturing stage, a resist mask 205r is to be formed, which may be accomplished by depositing a resist material and patterning the same using, in the embodiment shown, substantially the same process sequence as is also applied in the conventional process strategy, as described above. Consequently, an initial resist mask 205 is formed, which, however, provides an increased overlap with respect to an end portion 260e of the gate electrode structure 260c due to the increased lateral distance 260d, which thus reduces an extension of the end portion 260e above the isolation region 203. Consequently, the overlap 205o of the initial mask 205 is selected so that, upon performing a further resist material removal process, as for instance described with reference to the etch process 106 in FIG. 1f, the overlap 205o is sufficient to ensure coverage of the end portion 260e upon forming the mask 205r. Consequently, during the further processing, i.e., forming cavities in the active region 202a, undue exposure of the spacer layer 263 at the end portion 260e may be avoided and hence integrity of the sensitive material system 261 of the gate electrode structure 260c, in particular at the end portion 260e, during the further processing may also be enhanced. Thus, the further processing may be continued, as is, for instance, described with respect to the device 100 in the context of FIGS. 1g and 1h in order to incorporate a strain-inducing semiconductor material, such as the material 151 (FIG. 1h), into the active region 202a. Thereafter, the further processing may be continued by completing the transistor configurations by using processes that are well established in the art. Hence, the transistors 250a, 250c may be completed with respect to the desired predefined transistor design on the basis of processes as may also be used in conventional strategies.

Figure 2D:
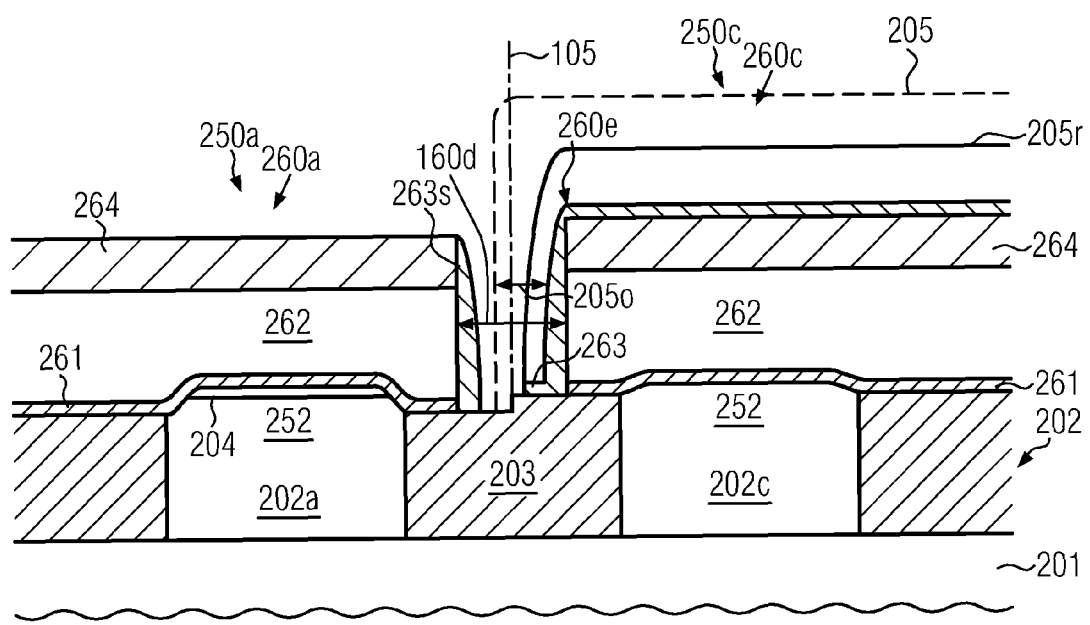

FIG. 2d schematically illustrates the device 200 according to further illustrative embodiments in which the gate electrode structures 260a, 260c may be implemented on the basis of the lateral distance 160d that corresponds to the lateral distance as used in conventional strategies, as discussed above with reference to the device 100. In order to provide superior confinement of the end portion 260e, the resist mask 205r may be formed by taking into consideration the previously determined degree of material erosion after forming the initial resist mask 205 and applying an additional resist etch process. To this end, the initial mask 205 may be formed with an appropriately dimensioned degree of overlap 205o, which is still sufficient to provide coverage of the end portion 260e when reducing the mask 205 to the mask 205r. In some illustrative embodiments, the increased overlap 205o may be obtained by using an appropriate lithography mask when performing a lithography process for irradiating the radiation-sensitive material of the resist mask 205, a corresponding modification of the lithography mask may be readily initiated on the basis of measurement results corresponding to the degree of material erosion that may usually take place upon "converting" the initial mask 205 into the reduced mask 205r. Consequently, the same process parameters and recipes may be applied upon forming the initial resist mask 205 and thereafter well-established resist removal processes may be applied in order to obtain the mask 205r while still ensuring reliable coverage of the end portion 260e during the further processing.

In other illustrative embodiments, the resist mask 205 may be formed on the basis of a conventional lithography mask, wherein, however, at least one process parameter of the lithography sequence, such as an exposure parameter, a prebake parameter and the like, may be determined such that the mask 205 may be obtained with increased lateral dimensions to as to obtain the desired overlap 205o. To this end, appropriate experiments may be performed in order to determine the increase of the lateral dimensions of the mask 205 in relation to variation of one or more process parameters of the lithography sequence.

Consequently, also in this case, the further processing may be continued as described above, wherein superior integrity of the end portion 260e may be achieved.

It should be appreciated that, in other illustrative embodiments (not shown), at least one of the etch processes for forming the mask 205r and/or patterning the gate electrode structures 260a, 260c with respect to the lateral distance thereof above the isolation region 203 may be redesigned in order to ensure a sufficient overlap upon reducing the resist mask 205 so that a reliable coverage of the end portion 260e is guaranteed. To this end, appropriate test runs may be performed, for instance with respect to using different etch gases, temperature, pressure and the like, in order to obtain the overlap 205o that is appropriate for compensating for the material reduction upon forming the mask 205r from the initial resist mask 205.

As a result, the present disclosure provides manufacturing techniques in which sophisticated high-k metal gate electrode structures may be formed in combination with a strain-inducing embedded semiconductor material in one type of transistor, wherein, in particular, the critical confinement of the gate electrode structures of N-channel transistors may be preserved. To this end, the degree of material erosion upon removing unwanted resist material of an initial resist mask may be taken into consideration, for instance in the form of CD modifications in the lithography mask and/or by selecting appropriate process parameters during lithography processes, etch processes and the like. Consequently, superior production yield may be obtained when producing semiconductor devices on the basis of a given transistor design without requiring additional processes and materials, while also well-established process tools may be used. Hence, superior reliability and yield is achieved without sacrificing overall throughput.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of fabricating a semiconductor device, the method comprising:
   determining a degree of exposure of an end portion of a gate electrode structure of a first N-channel transistor upon forming a first resist mask above said gate electrode structure, said end portion being formed above an isolation region separating an active region of said first N-channel transistor from an active region of a first P-channel transistor, said first N-channel and P-channel transistors being formed above a first substrate according to a predefined transistor design; and
   forming a second N-channel transistor and a second P-channel transistor according to said predefined transistor design above one or more second substrates by taking into consideration said determined degree of exposure so as to substantially avoid exposure of an end portion of a gate electrode structure of said second N-channel transistor formed above said one or more second substrates when forming a second resist mask for covering said gate electrode structure of said second N-channel transistor.

2. The method of claim 1, wherein forming said second N-channel transistor and said second P-channel transistor according to said predefined transistor design above one or more second substrates comprises increasing a lateral distance of said gate electrode structures of said second N-channel transistor and said second P-channel transistor along a transistor width direction compared to a lateral distance of said gate electrode structures of said first N-channel and P-channel transistors.

3. The method of claim 2, wherein increasing a lateral distance of said gate electrode structures of said second N-channel and P-channel transistors comprises controlling at least one of a process parameter and an exposure parameter upon forming a mask opening of a mask that is used for patterning said gate electrode structures of said second N-channel and P-channel transistors.

4. The method of claim 2, wherein increasing a lateral distance of said gate electrode structures of said second N-channel and P-channel transistors comprises increasing a lateral distance in a lithography mask without changing said predefined transistor design.

5. The method of claim 1, wherein forming said second N-channel transistor and said second P-channel transistor according to said predefined transistor design above one or more second substrates comprises increasing a degree of coverage of a resist mask when forming said resist mask above said gate electrode structure of said second N-channel transistor.

6. The method of claim 5, wherein increasing a degree of coverage of a resist mask comprises using a lithography mask designed to cover said second N-channel transistor and said gate electrode structure of said second N-channel transistor, wherein said lithography mask compensates for at least said determined degree of exposure.

7. The method of claim 1, further comprising forming a threshold voltage adjusting semiconductor alloy selectively on said active region of said second P-channel transistor prior to forming gate electrode structures.

8. The method of claim 7, further comprising forming a cavity in said active region of said second P-channel transistor in the presence of said second resist mask.

9. The method of claim 8, further comprising forming a spacer layer above said gate electrode structures of said second N-channel and P-channel transistors and forming a sidewall spacer on said gate electrode structure of said second P-channel transistor by using said second resist mask as an etch mask.

10. The method of claim 9, further comprising forming a strain-inducing semiconductor material in said cavities after removing said second resist mask and forming a sidewall spacer on said gate electrode structure of said second N-channel transistor.

* * * * *